United States Patent [19]

Bacchi et al.

[11] Patent Number: 5,697,759
[45] Date of Patent: Dec. 16, 1997

[54] METHOD OF ORIENTING A SPECIMEN CARRIER HOLDER IN AN AUTOMATED SPECIMEN PROCESSING SYSTEM

[75] Inventors: Paul Bacchi, Novato; Manuel J. Robalino, San Francisco, both of Calif.

[73] Assignee: Kensington Laboratories, Inc., Richmond, Calif.

[21] Appl. No.: 671,859

[22] Filed: Jun. 28, 1996

Related U.S. Application Data

[62] Division of Ser. No. 265,667, Jun. 24, 1994, Pat. No. 5,538,385.

[51] Int. Cl.$^6$ ............................................. B65G 49/07
[52] U.S. Cl. ........................ 414/786; 414/217; 414/938
[58] Field of Search .................................. 414/217, 331, 414/403, 404, 416, 786, 937, 938, 940

[56] References Cited

U.S. PATENT DOCUMENTS

| | | | |
|---|---|---|---|
| 4,597,708 | 7/1986 | Wheeler et al. | 414/331 |
| 4,636,128 | 1/1987 | Millis et al. | 414/217 |
| 4,643,629 | 2/1987 | Takahashi et al. | 414/331 |
| 4,768,640 | 9/1988 | Sticht | 198/396 |
| 4,776,744 | 10/1988 | Stonestreet et al. | 414/217 |
| 4,786,816 | 11/1988 | Ohmori et al. | 250/561 |
| 4,790,709 | 12/1988 | Sakimori et al. | 414/416 |
| 4,803,373 | 2/1989 | Imamura et al. | 250/561 |
| 4,859,137 | 8/1989 | Bonora et al. | 414/648 |
| 4,875,825 | 10/1989 | Tullis et al. | 414/786 |
| 4,895,486 | 1/1990 | Baker et al. | 414/331 |
| 5,003,188 | 3/1991 | Igari | 250/561 |
| 5,110,248 | 5/1992 | Asano et al. | 414/172 |
| 5,181,819 | 1/1993 | Sakata et al. | 414/217 |
| 5,186,594 | 2/1993 | Toshima et al. | 414/217 |
| 5,219,464 | 6/1993 | Yamaga et al. | 55/213 |
| 5,382,806 | 1/1995 | Bacchi et al. | 250/561 |
| 5,443,348 | 8/1995 | Biche et al. | 414/416 |
| 5,468,112 | 11/1995 | Ishii et al. | 414/940 X |

FOREIGN PATENT DOCUMENTS

| | | | |
|---|---|---|---|
| 63-72137 | 4/1988 | Japan . | |
| 2178948 | 7/1990 | Japan | 414/940 |
| 4189483 | 7/1992 | Japan | 414/940 |
| 5090384 | 4/1993 | Japan | 414/940 |

OTHER PUBLICATIONS

IBM Technical Disclosure Bulletin, vol. 31 No. 10, Mar. 1989 Dual Microscope Semiconductor Wafer Inspection Machine.

*Primary Examiner*—James W. Keenan
*Attorney, Agent, or Firm*—Stoel Rives LLP

[57] ABSTRACT

A method of loading a specimen carrier in an automated specimen processing system facilitates loading into or removing from a tiltable specimen carrier holder a fully loaded specimen carrier by a user with much less risk of repetitive stress injuries than is associated with prior art ways of performing those acts. The tiltable carrier holder has a receiving member and a bottom member. The receiving member is equipped with a guide. The user loads the carrier into the carrier holder by placing in the guide a guide member formed on a back of the carrier. During this action, the holder is oriented in a load position in which a front opening of the carrier faces generally upward and a back opening of the carrier faces generally downward. The carrier is then tilted so that it is supported by its base on the bottom member in an operating position with the front opening oriented for presentation of the specimens to the processing system. The method allows users to manually load such carriers into, or to remove such carriers from, the carrier holder by using two hands to hold a respective one of two sides of the carrier without substantial flexure of either of the wrists. This greatly reduces the risk of repetitive stress injuries.

11 Claims, 10 Drawing Sheets

METHOD OF ORIENTING A SPECIMEN CARRIER HOLDER IN AN AUTOMATED SPECIMEN PROCESSING SYSTEM

RELATED APPLICATION

This is a division of application Ser. No. 08/265,667, filed Jun. 24, 1994, now U.S. Pat. No. 5,538,385.

TECHNICAL FIELD

The present invention pertains to systems for performing an automated operation on a selected one of multiple specimens contained in a specimen carrier and, in particular, to a method of orienting a specimen carrier in such a system before, during, and after an operation on the specimens.

BACKGROUND OF THE INVENTION

Fabrication plants that manufacture semiconductor electronic components from semiconductor wafers typically include a wide variety of process stations at which wafers in different stages of manufacturing undergo process steps, are evaluated for the possible presence of defects, or are catalogued, sorted, or otherwise handled. To reduce the risk of contamination and breakage brought about by activity of human beings, the process stations typically are partly or wholly automated.

The wafers are typically moved from one station to another in a wafer carrier that a human being manually installs in and later removes from a process station. The wafer carrier is typically designed to allow automated removal of wafers from it and insertion of wafers into it and to allow contaminants present on or around wafers in it to drop away from it. A handle is usually placed at the top of the carrier so that a human being can conveniently hold it with one hand while walking between process stations.

Because of the high throughput of contemporary fabrication plants, employees who load wafer carriers into, remove them from, and move them among process stations may handle loaded carriers hundreds of times each day. Those employees have loaded the carriers into, or removed them from, process stations by holding the top handle in one hand and flexing the wrist to which that hand is connected to load the carrier into, or to remove it from, an operating position in which the carrier is oriented for presentation of the wafers to the apparatus. A fully loaded wafer carrier may weigh as much as 4 kilograms (about 9 pounds). The weight of the carrier when it holds a substantial fraction of its capacity of wafers places substantial stress on the flexed wrist; that stress is believed to be a substantial cause of an unusually high rate of so-called "repetitive strain injuries" or "cumulative trauma" such as carpal tunnel injury, a painful and potentially disabling condition, among those workers. There is a need to reduce the incidence of such injuries.

SUMMARY OF THE INVENTION

An object of the invention is to provide a method by which a fully loaded wafer carrier may be loaded into, or removed from, a holder in a process station either by a human being with much less risk of repetitive stress injuries than is associated with prior art ways of performing those acts, or by automated machinery.

One aspect of the invention provides, in an apparatus for performing an automated operation on a selected one of multiple specimens contained in a specimen carrier, a tiltable specimen carrier holder into which a human being can manually load, and from which the human being can manually remove, a fully loaded specimen carrier with the reduced risk of repetitive stress injuries. The tiltable carrier holder has a receiving member that cooperates with part of the carrier (a guide member) to place and hold the carrier by gravity in a predetermined alignment relative to the receiving member. The apparatus also has a bottom member that cooperates with the receiving member to secure the carrier in the alignment. In a preferred embodiment, the receiving and bottom members are joined to form a rigid right angle structure, and a pivot pivotally connects the receiving member to the apparatus so that the receiving member and the bottom member can pivot between a load position and an operating position. In the load position the receiving member is oriented to allow convenient manual insertion and removal of the carrier without substantial flexure of either of the human being's wrists. In the operating position the bottom member is oriented to support the carrier and to orient it so that the apparatus can perform the operations on the selected specimen.

Another aspect of the invention provides a method of loading the carrier in an operating position in the apparatus. A tiltable carrier holder is provided, having a receiving member and a bottom member. The receiving member is equipped with a guide. The carrier is loaded into the carrier holder by placing in the guide a guide member formed on a back of the carrier. During this action, the holder is oriented in a load position in which a front opening of the carrier faces generally upward and a back opening of the carrier faces generally downward. The carrier is then tilted so that it is supported by its base on the bottom member in an operating position with the front opening oriented for presentation of the specimens to the apparatus.

The apparatus and the method of the invention can use prior art wafer carriers of the type described above and in connection with FIGS. 1–3. The apparatus and method allow workers manually to load such carriers into, or to remove such carriers from, the apparatus by using two hands to hold a respective one of two sides of the carrier without substantial flexure of either of the wrists. This greatly reduces the risk of repetitive stress injuries.

The apparatus and the method are also useful where automated machinery places the carrier into, or removes it from, the holder.

Additional objects and advantages of the present invention will be apparent from the detailed description of preferred embodiments thereof, which proceeds with reference to the accompanying drawings.

DETAILED DESCRIPTION OF PREFERRED EMBODIMENTS

Figure 1:
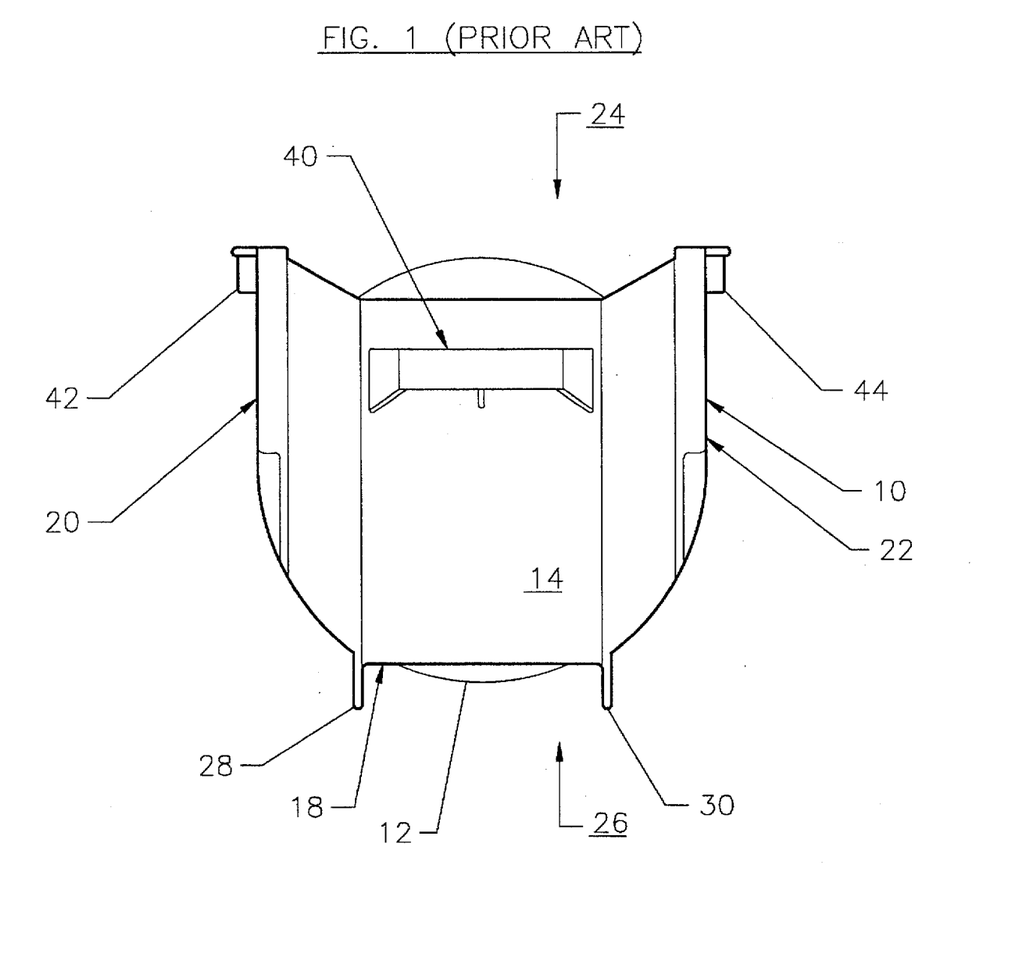
FIG. 1 is a top view of a prior art wafer carrier.
Figure 2:
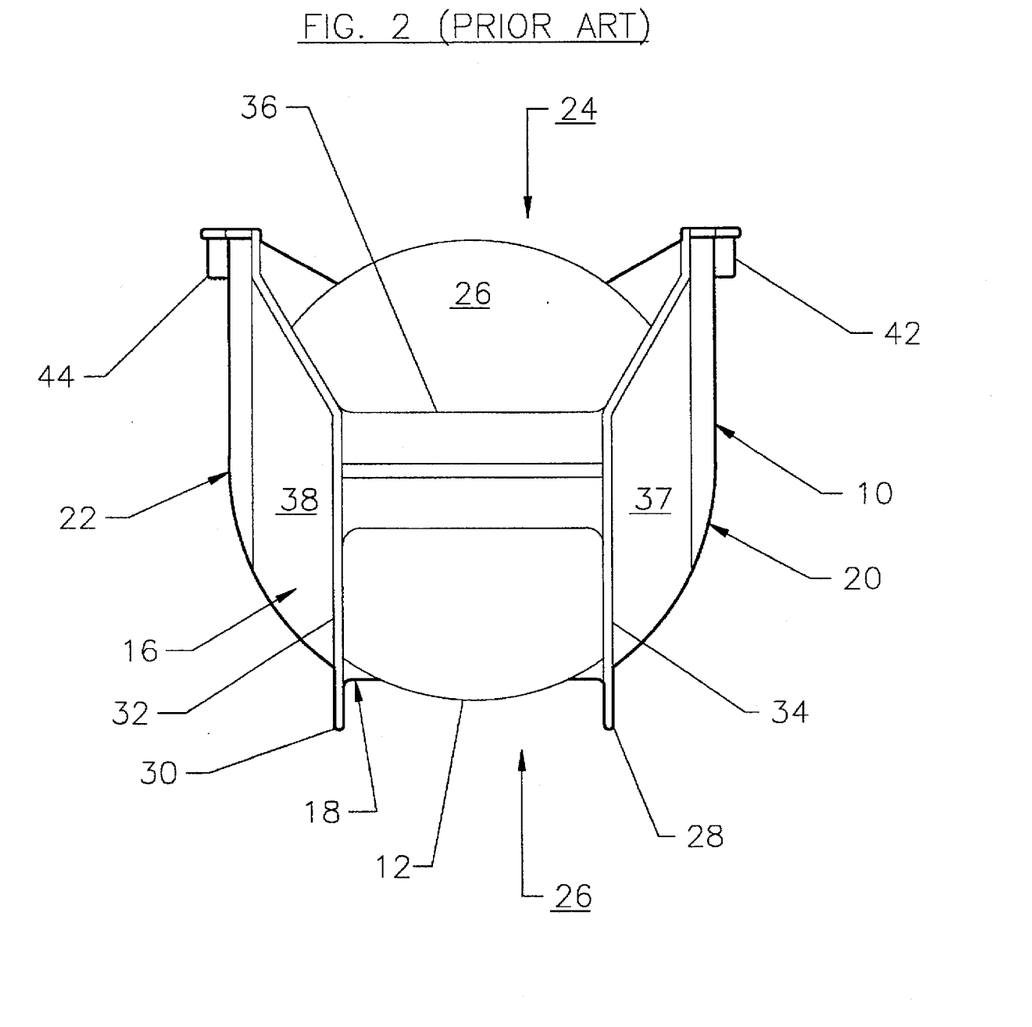
FIG. 2 is a bottom view of the carrier of FIG. 1.
Figure 3:
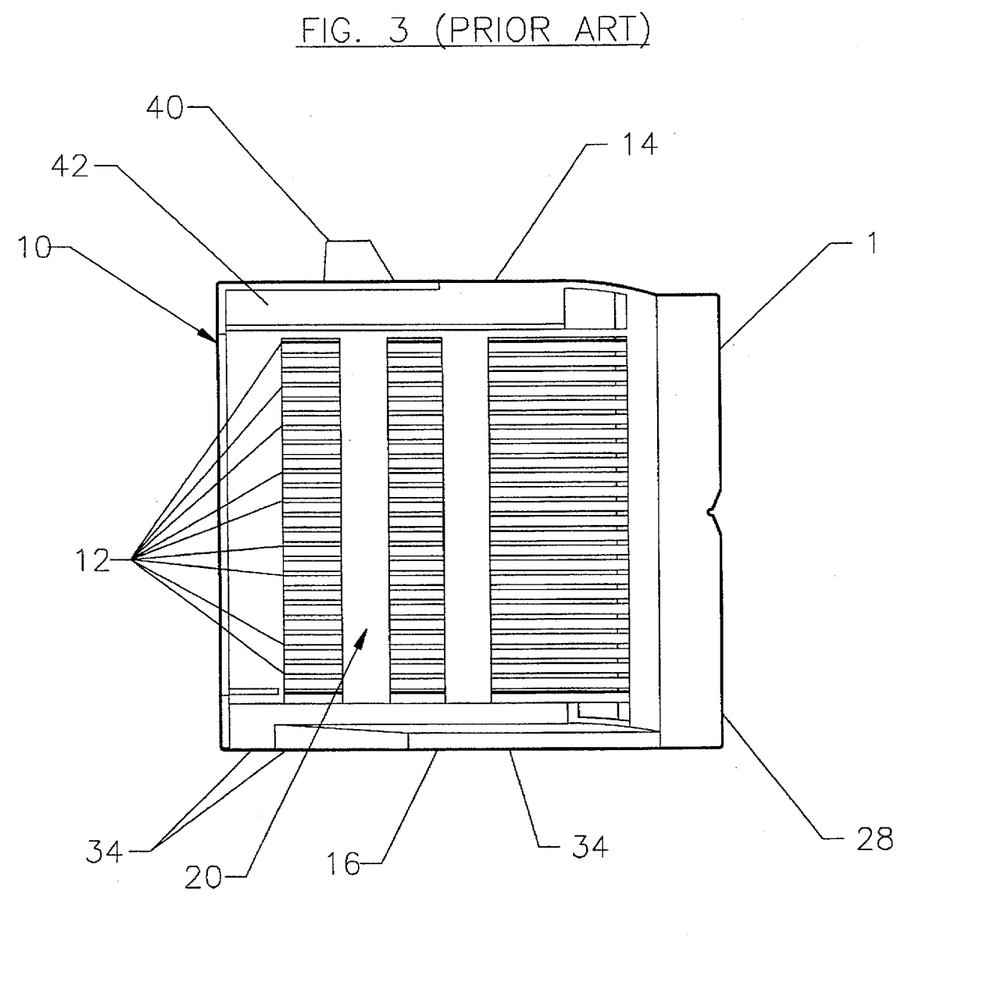
FIG. 3 is a side elevational view of the carrier of FIG. 1.

With reference to FIGS. 1–3, a prior art wafer carrier 10 (also called a specimen carrier or wafer cassette) is adapted to store one or more (typically as many as 25) generally planar wafers 12 (also called specimens or disks) in a stacked relationship. Wafers 12 are usually formed of a semiconductor material such as silicon or gallium arsenide. Wafer 12 may also contain a layer of a semiconductor material, e.g., one or more layers defining electronic circuits that are being or have been manufactured on the wafer. Carrier 10 has a top 14, a base 16, a back 18, and two opposing sides 20 and 22 connected to base 16 and back 18. Sides 20 and 22 define a front opening 24 and a rear opening 26. Sides 20 and 22 are formed so that they converge toward each other near rear opening 26 so that it is smaller than front opening 24. Front opening 24 is sized for insertion of wafers 12 into, and for removal of wafers 12 from, carrier 10. Back opening 26 is sized for retention of wafers 12 in carrier 10. Each of wafers 12 has a generally planar lower surface portion 27 that is adjacent front opening 24 when wafers 12 are positioned in carrier 10.

Carrier 10 stores wafers 12 essentially parallel to one another and in a generally horizontal orientation when carrier 10 is in an upright position as shown in FIG. 3. The interior surface (not shown) of each of sides 20 and 22 is provided with plural parallel spaced apart projections (not shown), which form parallel grooves (not shown). Each groove in the interior surface of side 20 is coplanar with a corresponding groove in the interior surface of side 22; each pair of coplanar grooves forms a slot 23 (FIG. 4) adapted to support a wafer 12. Conventionally, each slot is parallel to base 16.

Back 18 includes two spines or guide members 28 and 30 that project from back 18 to support carrier 10 when it is oriented so that front opening 24 is directed generally upward and back opening 26 is directed generally downward. Base 16 includes two support members 32 and 34 that project away from base 16 to support carrier 10 when it is oriented so that front opening 24 is directed generally horizontally. Support members 32 and 34 are linked through cross member 36 and through respective base areas 37 and 38 and their connection with respective sides 20 and 22 and top 14.

Top 14 is usually provided with a handle 40 by which carrier 10 is manually supported by one hand (not shown) of a human being in carrying carrier 10 and in the prior art method of loading carrier 10 into, or removing carrier 10 from, an apparatus for performing an operation on one or more wafers 12 contained in carrier 10.

Each of sides 20 and 22 is provided with a respective one of first and second flanges 42 and 44, which are located so that a respective one of the hands of a human being can grasp them for handling carrier 10.

Figure 4:
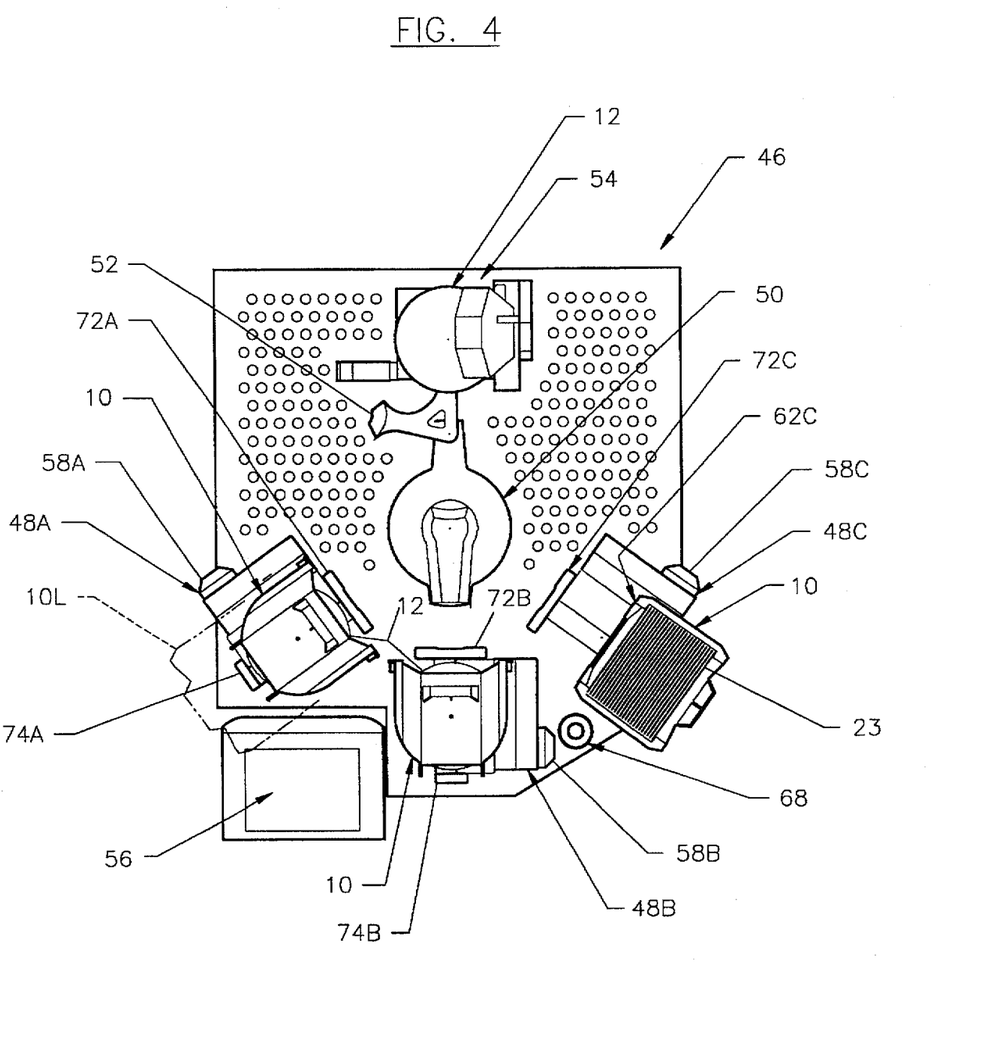
FIG. 4 is a top view of an automated wafer inspection station including a tiltable holder according to the invention.
Figure 5:
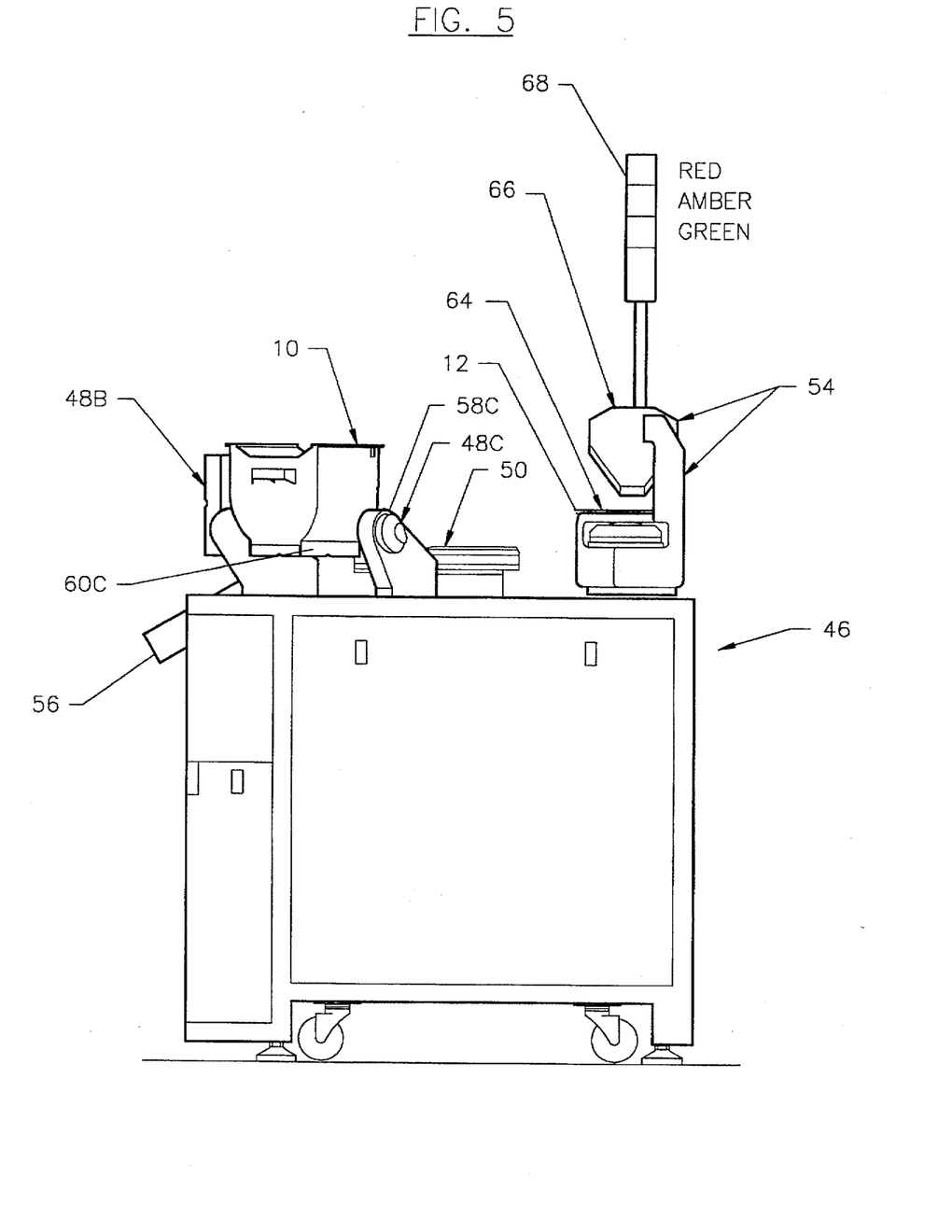
FIG. 5 is a side elevational view of the station of FIG. 4.

FIGS. 4 and 5 are respective top and side elevational views of an apparatus or automated wafer identification station 46 for performing an operation on or inspecting one or more wafers 12 contained in carrier 10. Station 46 includes three tiltable carrier holders 48A, 48B, and 48C, each of which is shown holding a carrier 10. Carriers 10 in holders 48A and 48B are shown containing one or more wafers 12; carrier 10 in holder 48C is shown without wafers.

Holders 48A and 48B are shown in an operating position in which inspection station 46 can inspect wafers 12 in carriers 10; holder 48C is shown in a load position. The location of carrier 10 when mounted in holder 48A in the load position is shown by phantom lines 10L.

A robotic transfer mechanism 50 positions a transfer arm 52 so that it selectively removes any one of wafers 12 from a carrier that is in the operating position, e.g., one of carriers 10 in holders 48A or 48B, and positions that wafer for identification by an optical character reader (OCR) 54, reverses that transfer, or transfers that wafer 12 to a carrier 10 other than the one from which it was taken. FIG. 4 shows transfer arm 52 holding one of wafers 12 near OCR 54; in FIG. 5 transfer arm 52 is in a different position and not shown. A preferred transfer mechanism 50 is a Kensington Laboratories, Inc., Model No. WH4, and a preferred OCR 54 is a Kensington Laboratories, Inc., OCR equipped with a Foresight™ illuminator.

Operations performed by station 46 are controlled by a servomechanism that receives commands delivered from an OS/2™-based computer having a touch-actuated display 56. Touch-actuated display 56 selectively displays information about the status of station 46 and wafers 12 or accepts commands to the computer entered by manual actuation of the display.

Each of holders 48A–48C is selectively moveable under control of the computer to tilt or pivot between the load position, the operating position, and a hold position described below on a respective one of pivots 58A–58C located to allow such movement. Computer control of the pivotal movement of the holders promotes reliable, reproducible, controllable, and safe pivotal movement of the holders so that wafers 12 contained in them are not subjected to mechanical shock or even partial motion out of carriers 10. The pivot point placement represents a design compromise between compact installation for clearance in motion and ease of use. Positioning the pivot at or near the center of the carrier holder allows it to pivot within the volume of space it occupies. Positioning the pivot at the bottom or rear of the carrier holder facilitates convenient storage such as by mounting it in a recessed area of a wall and allowing the carrier to tilt outwardly to present its contents for processing.

In a preferred embodiment, holders 48A–48C are mounted for ease in manual loading and unloading of a carrier 10. Each of the pivots is attached to only one side of its respective holder, which leaves the other side of that holder free for manual loading of carrier 10 in, and removal of carrier 10 from, that holder. Pivots 58A–58C are further located in a position that is near the junction of respective receiving members 60A–60C and bottom members 62A–62C to allow for easy manual access on both sides of respective holders 48A–48C to carrier 10 when those holders are in the load position. To further facilitate placement of carrier 10 in the holders, holder 48A has pivot 58A attached on its left-hand side, and holders 48B–48C have a respective one of pivots 58B–58C attached on their right-hand side.

When any one of holders 48A–48C is in the load position, carrier 10 aligned in them is supported by a respective one of receiving members 60A–60C (only receiving member 60C shown) (FIG. 5). Receiving members 60A–60C cooperate with guide members 28 and 30 (FIGS. 1–3) to place and hold one of carriers 10 in a predetermined alignment relative to the receiving member when holders 46A–46C are in the load position. One of bottom members 62A–62C (only bottom member 62C shown) (FIG. 4) cooperates with support members 32 and 34 of one of carriers 10 and with a respective one of receiving members 60A–60C to secure carrier 10 in the predetermined alignment.

OCR 54 includes a prealigner stage 64 and an OCR illumination system 66. Station 46 also includes a status indicator 68 mounting red, amber, and green lights activated under control of the computer to display an indication of the status of the station.

One of automatic scanning or wafer location systems 69A–69C (also FIGS. 6A–10) is associated with a respective one of holders 48A–48C. Each of systems 69A–69C has a respective one of front and back inspection arms 70A–70C and 71A–71C continuously moveable in a respective pair of slots 72A–72C between a lowered position (FIGS. 4–10) and a raised position (not shown). As a respective pair of inspection arms 71A–71C and 72A–72C moves between the lowered and raised positions, optical inspection apparatus (not shown) contained in them passes front and back openings 24 and 26 of the carrier 10 mounted on a respective one of holders 48A–48C to determine the number and location of any wafers 12 present in that carrier. The operation of the inspection apparatus is described in U.S. Pat. No. 5,382,806 of Bacchi et al. for a SPECIMEN CARRIER PLATFORM AND SCANNING ASSEMBLY, assigned to the assignee of this application, and incorporated by reference herein.

FIGS. 6A, 6B, 7, 8, and 9 show a holder assembly 73B that includes holder 48B and components associated with it in, respectively, an elevational view from the interior of station 46 looking toward the outside of station 46, a detailed view of a roller, a side elevational view, a top view, and an isometric view. In each of FIGS. 6A–9 holder 48 is in the operating position. Assembly 73B is installed in station 46, as are a corresponding assembly (not shown) for each of holders 48A and 48C that is identical to assembly 73B except for the different position of pivot 58A in holder 48A.

Figures 6A, 6B:
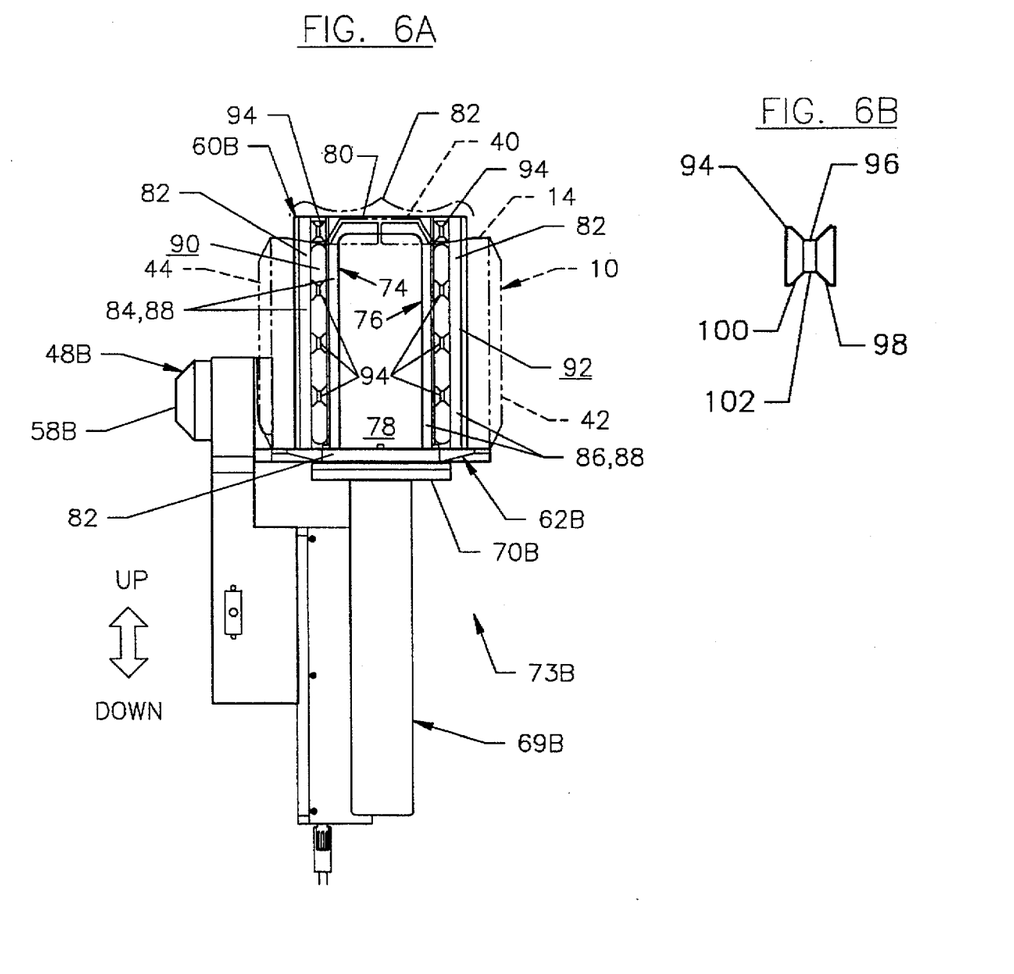
FIG. 6A is an elevational view from the interior of the station of FIG. 4 of a holder assembly that includes the tiltable holder of FIG. 4 in an operating position.
FIG. 6B is a detailed view of one of the rollers shown in FIG. 6A.
Figure 7:
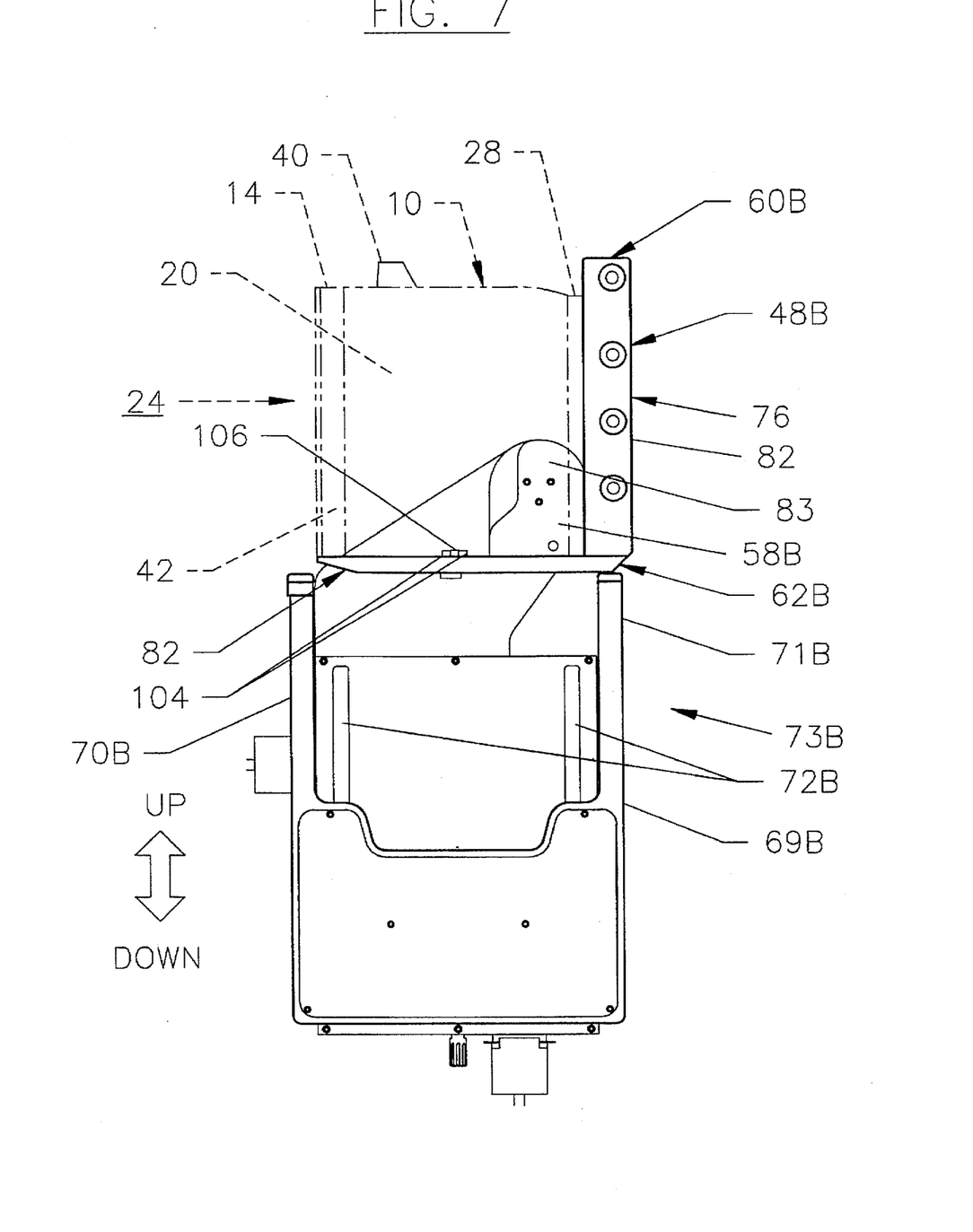
FIG. 7 is a side elevational view of the items shown in FIG. 6A in the operating position.
Figure 8:
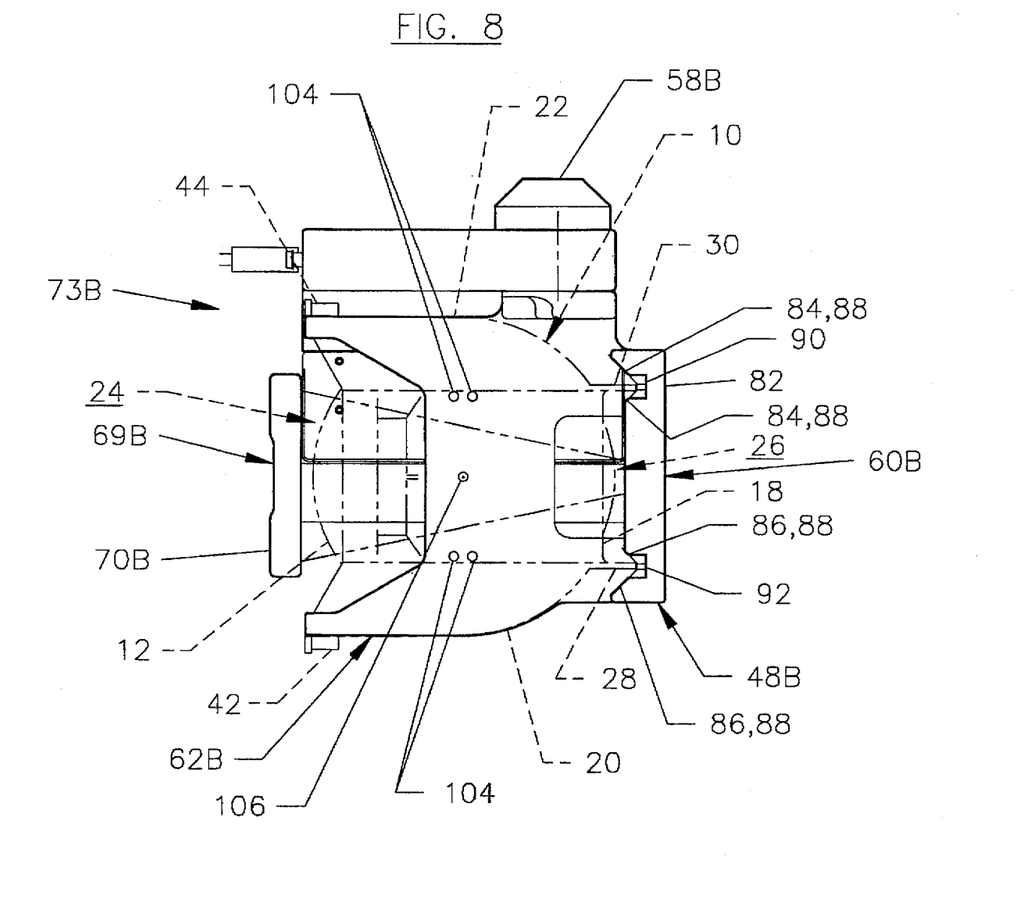
FIG. 8 is a top view of the items shown in FIG. 6A in the operating position.
Figure 9:
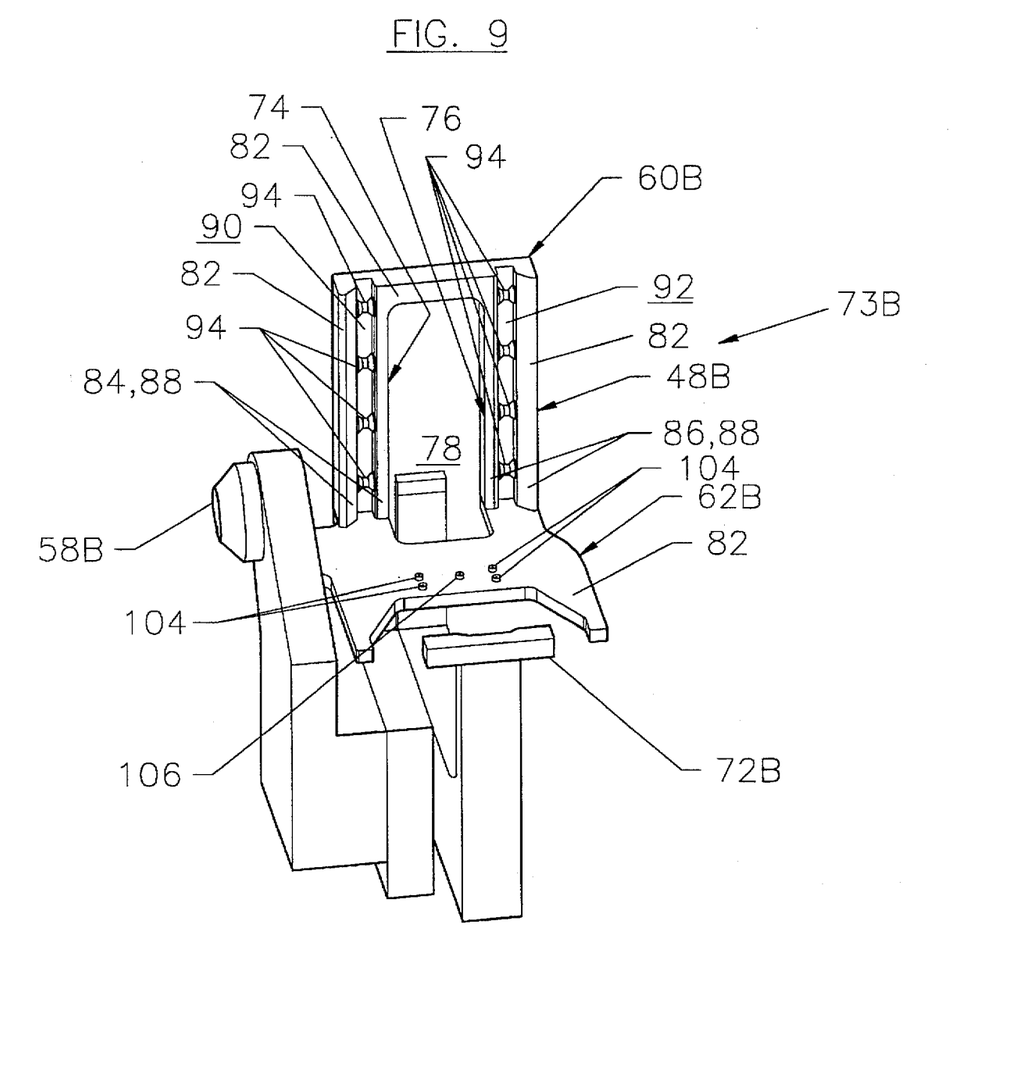
FIG. 9 is an isometric view of some of the items shown in FIG. 6A in the operating position.

Receiving member 60B includes first and second spaced apart receiving arms 74 and 76 that define between them a receiving arm opening 78 to minimize contaminant particle entrapment. Receiving arms 74 and 76 are joined by a cross member 80 to constitute receiving member 60B; they are also joined by bottom member 62B, which together with receiving member 60B forms a mechanically unitary member 82. A pivot plate 83 attaches pivot 58B to receiving member 60B to provide maximum clearance for the placement of carrier 10 but may alternatively attach to bottom member 62B. Each of receiving arms 74 and 76 has respective one of first and second pairs 84 and 86 of opposing beveled edges 88 that form guides that receive guide members 28 and 30 of carrier 10. Each pair 84 and 86 defines between its beveled edges a respective one of first and second elongated slots 90 and 92 that minimize particle entrapment. Beveled edges 88 of each pair 84 and 86 are inclined toward the one of respective slots 90 and 92 defined by those edges.

Each of receiving arms 74 and 76 includes plural rollers 94 that are rotatably supported in each of slots 90 and 92. Each of rollers 94 (FIG. 6B) has a surface 96 that includes two guide surface portions 98 and 100 and a bearing surface portion 102 separating them. Guide surface portions 98 and 100 are inclined toward bearing surface portion 102 and cooperate with one of guide members 28 and 30 to urge that guide member by gravity toward and onto bearing surface portion 102 in the predetermined alignment. Guide surface portions 98 and 100 and bearing surface portion 102 define an external surface formed of a polymer composition that neither retains contaminants nor generates particles by abrasion and therefore can be easily cleaned. To provide such a surface, each roller 94 is formed of black polypropylene. Slots 90 and 92 are open except where rollers 84 are located.

When receiving member 60B receives carrier 10 from the hand of a human being or from automated machinery, beveled edges 88, slots 90 and 92, guide surface portions 98 and 100, and bearing surface portion 102 of each roller 94 cause carrier 10 to self-align by gravity, in the predetermined alignment, even if it is initially inserted in a somewhat misaligned orientation.

Bottom member 62B is provided with alignment pins 104 (FIGS. 7–8) that cooperate with recesses (not shown) formed in carrier 10 to locate carrier 10 in the predetermined alignment when it is loaded on receiving member 60B and/or supported on bottom member 62B. A sensing pin 106 (FIG. 8) cooperates with electronic components (not shown) to sense the presence of carrier 10 in holder 48B and to communicate that presence to the computer that controls holder assembly 64B.

Figure 10:
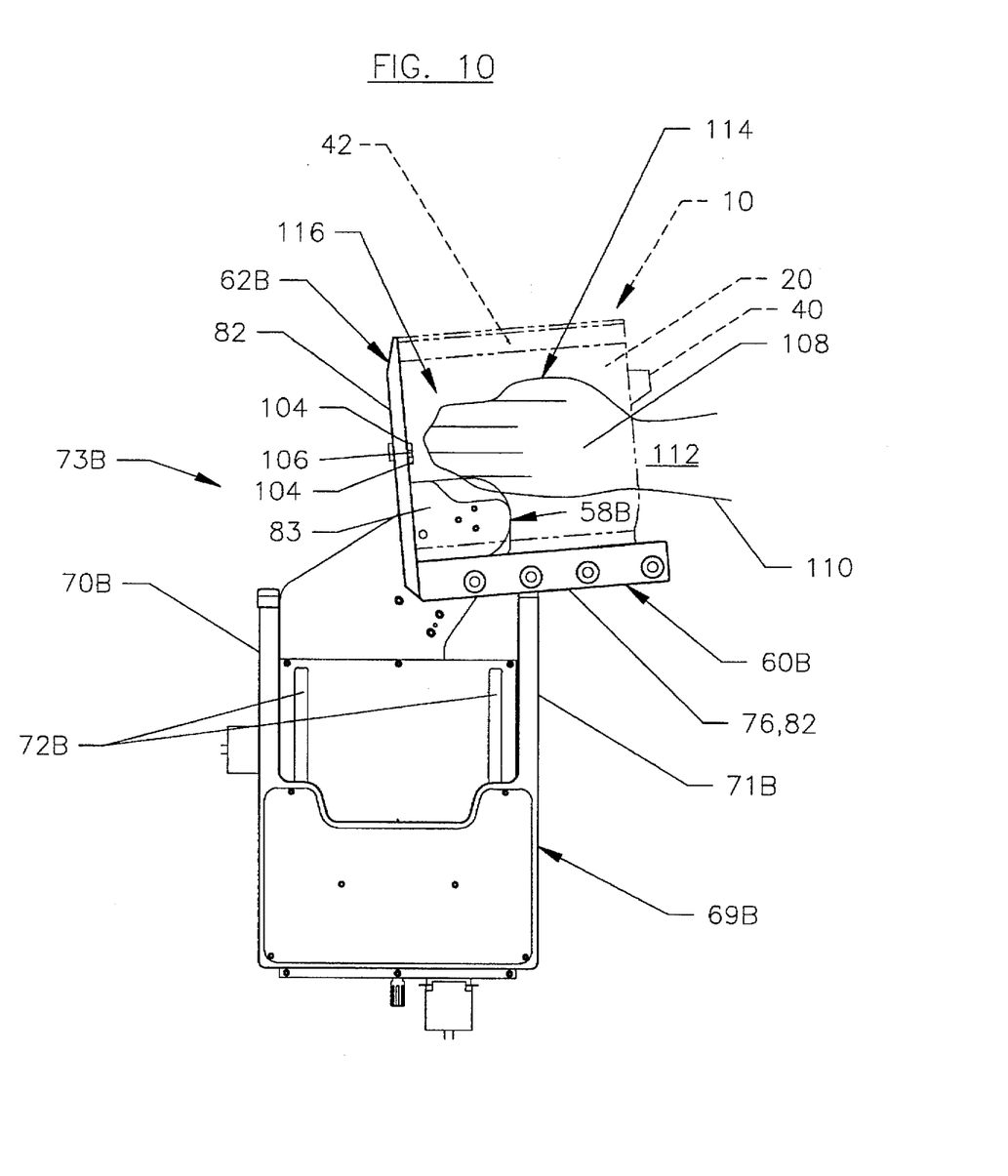
FIG. 10 is a side view of a carrier being manually loaded into, or removed from, the items shown in FIGS. 6A–9, with the holder in the load position.

FIG. 10 is a side elevational view of holder assembly 64B with holder 48B in the load position and of a carrier 10 in the process of being manually placed into, or removed from, holder 48B with hands 108 (only the left hand shown) of a human being 110. Hands 108 support carrier 10 by holding a respective one of sides 20 and 22 between them rather than by handle 40 and do so without substantial flexure of either of the human being's wrists 112. Thus, when holder 48B is in the load position, receiving member 60B receives carrier 10 from, or delivers it to, hands 108 for convenient manual insertion and removal of carrier 10 by human being 110 without substantial flexure of either of wrists 112. Hands 108 can also support carrier 10 for manual placement into, or removal from, holder 48B by direct contact between any one or more of thumb 114 and fingers 116 of one of the left and right hands and a respective one of flanges 42 and 44, again without substantial flexure of either of wrists 112. When human being 110 supports carrier 10 in one of those ways, the risk of a repetitive stress injury to hands 108 and wrists 112 is greatly reduced.

Holder 48 is operated as follows. When holder 48 does not contain a carrier 10 and is to be loaded with a holder, it is tilted to the load position (FIG. 10). In the load position receiving member 60B is separated from the horizontal by an angular displacement of, e.g., about 5 degrees above the horizontal to promote loading and retention of carrier 10 in receiving member 60B. Human being 110 manually loads carrier 10 in holder 48 by placing guide members 28 and 30 in a respective one of slots 90 and 92, and carrier 10 self-aligns by gravity in holder 48 to the predetermined alignment, as described above. Alternatively, automated machinery (not shown) loads carrier 10 in holder 48 in the same way and with the same results. In the load position holder 48 orients front opening 24 of carrier 10 (FIGS. 1–3) generally upward and back opening 26 of carrier 10 generally downward; this seats wafers 12 by gravity in reproducible locations relative to carrier 10 (e.g., toward back 18 of carrier 10 to reproducible locations in the slots formed in carrier 10 to hold wafers 12).

Holder 48 and carrier 10 are then tilted to the hold position (not shown) in which wafers 12 are urged by gravity toward retention in carrier 10 and carrier 10 is urged by gravity to a reproducible location relative to receiving member 60B and bottom member 62B. Hold position is separated from the horizontal by an angular displacement of, e.g., about 2–3 degrees above the horizontal to avoid migration of wafers 12 out of carrier 10 because of, e.g., vibrations.

To further ensure reproducible location of wafers 12, holder 48 and carrier 10 are then tilted to about the load position so that wafers 12 are again urged by gravity toward the reproducible locations. The carrier is then tilted to one of the hold and operating positions. In the operating position carrier 10 is supported by base 16, specifically by support members 32 and 34 (FIGS. 2–3), with front opening 24 oriented for presentation of wafers 12 to transfer arm 52 (FIG. 4). In that position each of bottom member 62B, front opening 24 of carrier 10, and planar lower surface portions 27 of wafers 12 contained in carrier 10 is tilted at an angular displacement of about 0.5 degree relative to or down from the horizontal to enhance mechanical pickup of wafers 12 by transfer arm 52. Thus, the load and operating positions are separated by an angular displacement of about 95.5 degrees, and the hold and operating positions are separated by an angular displacement of about 2.5–3.5 degrees.

To remove carrier 10 from holder 48B, holder 48B is tilted to the load position, and carrier 10 is removed from receiving member 60B as described above, either manually or by automated machinery.

The invention includes features that make it desirable for use in applications that use automated machinery to load carrier 10 into, or to remove it from, holders 48. The relative insensitivity to holder initial misalignment upon loading permits a broader spatial tolerance for holder placement by machine loading equipment. A selective positioning of the pivot for, e.g., wall-mounted storage can provide flexibility in equipment arrangement. Finally, the vertical positioning of the wafers during loading and unloading provides the safest, cleanest, and most stable orientation to preserve the wafers because they are positioned edge downward in the carrier.

It will be apparent to skilled persons that many changes may be made to details of the specific embodiments of the invention described herein without departing from the underlying principles thereof. The scope of the invention should, therefore, be determined only by the following claims.

We claim:

1. A method of positioning a specimen carrier in an apparatus for performing an automated operation on one or more of multiple specimens contained in the carrier, the carrier including a back that includes two guide members, a base that includes a support member, and two sides, each of the sides connected to the back and the base, the sides defining a front opening sized for insertion of specimens into the carrier and for removal of the specimens from the carrier, the method comprising:

providing a tiltable carrier holder rotatable about a pivot between a load position and an operating position in which the apparatus can perform the operation on the specimens, the carrier holder including a receiving member conjoined with a bottom member, the receiving member equipped with two guides, each guide having a length along which multiple rollers are supported, each guide having distal and proximal ends positioned respectively farther from and nearer to the pivot, and each guide extending generally horizontally outwardly from the pivot when the carrier holder is in the load position, and the bottom member extending generally upwardly from the pivot when the carrier holder is in the load position;

orienting the carrier holder in the load position;

loading the carrier in the carrier holder by engaging the guide members in the guides and sliding the carrier along the rollers toward the proximal end of the receiving member; and tilting the carrier holder to the operating position so that the carrier is supported by its base on the holder bottom member with the front opening oriented for a substantially horizontal presentation of specimens to the apparatus.

2. The method of claim 1, in which loading the carrier is performed by a human being and comprises holding the sides of the carrier between the two hands of the human being and placing the carrier in the carrier holder without substantial flexure of either of the human being's wrists.

3. The method of claim 1, in which the sides of the carrier are provided with respective first and second flanges, and loading the carrier in the carrier holder comprises supporting the carrier by the flanges with the two hands of the human being and placing the carrier in the receiving member without substantial flexure of either of the human being's wrists.

4. The method of claim 1, in which loading the carrier is performed by automated machinery.

5. The method of claim 1, further comprising:
tilting the carrier holder to the load position; and
removing the carrier from the carrier holder.

6. The method of claim 5, in which removing the carrier from the receiving member is performed by a human being and comprises:

holding the sides of the carrier between the two hands of the human being; and pulling the carrier from the receiving member without substantial flexure of either of the human being's wrists.

7. The method of claim 5, in which the sides are provided with respective first and second flanges that cooperate with a respective one of the hands of a human being to support the carrier, and removing the carrier from the receiving member comprises supporting the carrier by the flanges with the two hands of the human being and pulling on the two flanges with the two hands of the human being to remove the carrier from the receiving member without substantial flexure of either of the human being's wrists.

8. The method of claim 1, in which the carrier holder is rotatable into a hold position intermediate between the load position and the operating position and in which positioning the specimen carrier into the hold position results in specimens held within the carrier being urged by gravity toward reproducible locations relative to the carrier and including tilting the carrier holder to the hold position.

9. The method of claim 1, in which the specimens include a layer of a semiconductor material.

10. A method of placing a specimen carrier in an operating position in an apparatus for performing an automated operation on one or more of multiple specimens contained in the carrier, the carrier including a back that includes a guide member, a base that includes a support member, and two sides, each of the sides connected to the back and the base, the sides defining a front opening sized for insertion of specimens into the carrier and for removal of the specimens from the carrier, the method comprising:

providing a tiltable carrier holder having a receiving member and a bottom member, the receiving member equipped with a guide;

loading the carrier in the carrier holder by placing the guide member in the guide, the holder oriented in a load position so that the front opening faces generally upward and the back faces generally downward;

after loading the carrier in the holder, tilting the carrier to a hold position in which the specimens are urged by gravity toward retention in the carrier; and tilting the carrier so that it is supported by its base on the bottom member in the operating position with the front opening oriented for presentation of the specimens to the apparatus.

11. The method of claim 10, further comprising, after tilting of the carrier to the hold position but before tilting the carrier so that it is supported in the operating position, tilting the carrier to about the load position so that the specimens are urged by gravity toward reproducible locations relative to the carrier.

* * * * *